Figure 1:
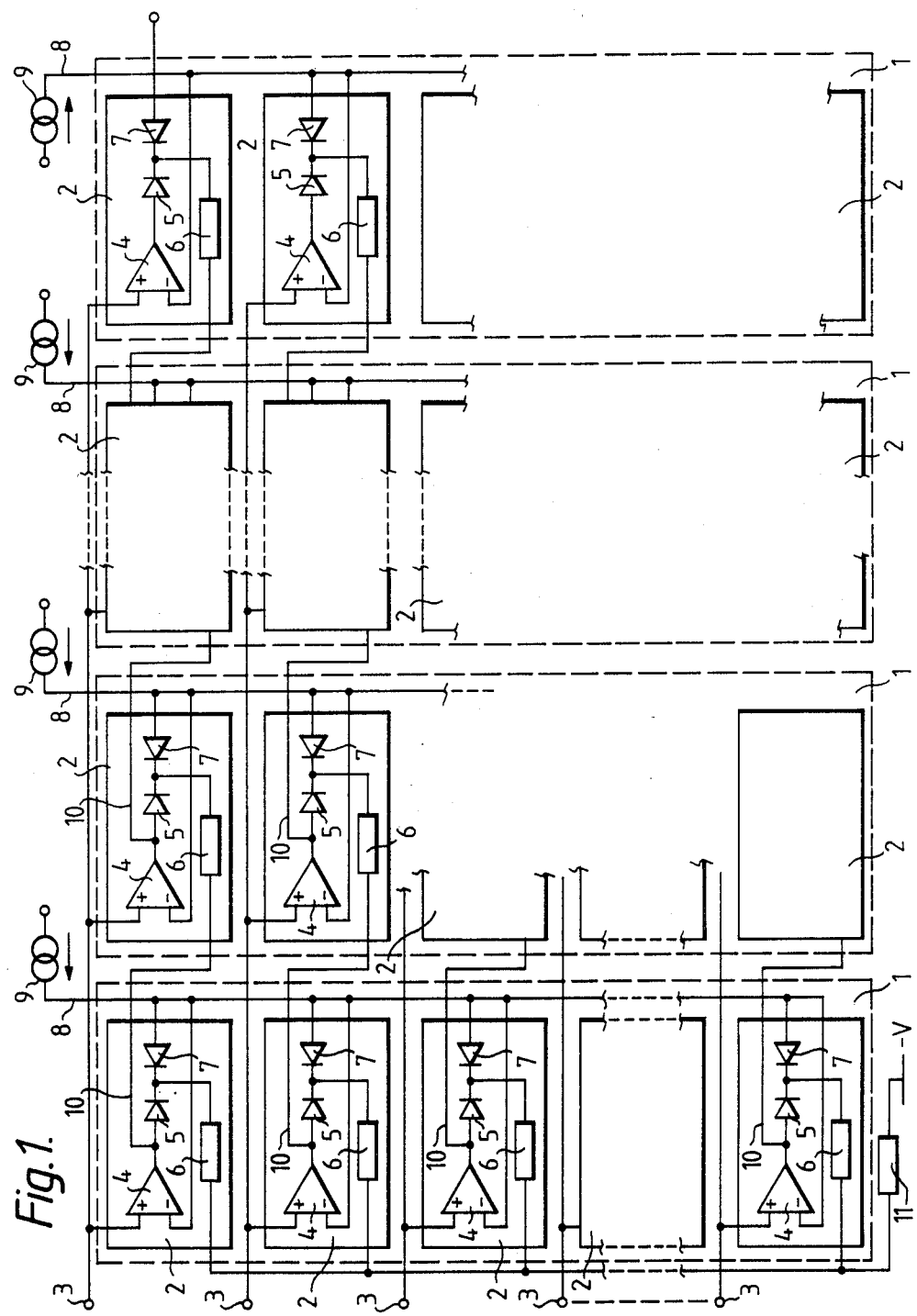

United States Patent [19]

Brentnall

[11] Patent Number: 4,583,010

[45] Date of Patent: Apr. 15, 1986

[54] SIGNAL DISCRIMINATING APPARATUS

[75] Inventor: John F. Brentnall, Hertfordshire, England

[73] Assignee: British Aerospace Public Limited Co., London, England

[21] Appl. No.: 496,562

[22] Filed: May 20, 1983

[30] Foreign Application Priority Data

May 20, 1982 [GB] United Kingdom ................. 8214711

[51] Int. Cl.$^4$ ............................................. H03K 5/24
[52] U.S. Cl. .................................... 307/355; 307/359; 307/357; 328/147; 328/137
[58] Field of Search ............... 307/355, 356, 357, 359; 328/146, 147, 137

[56] References Cited

U.S. PATENT DOCUMENTS

| | | | |
|---|---|---|---|
| 3,492,588 | 1/1970 | Woodward, Jr. | 328/147 |
| 3,596,107 | 7/1971 | Kittrell | 328/147 |
| 3,610,950 | 10/1971 | Keller et al. | 328/147 |
| 3,631,352 | 12/1971 | Kelley et al. | 307/357 |

Primary Examiner—John Zazworsky
Attorney, Agent, or Firm—Cushman, Darby & Cushman

[57] ABSTRACT

Signal discriminating apparatus for receiving a plurality of analog signals and for selecting therefrom a particular signal of which the value bears some predetermined relationship to the values of the other signals, for example the median value signal, comprises a sequence of extreme value selector circuits each operable for receiving the signals or a sub-set thereof and for picking out an extreme-value one of the received signals, and disabling means for causing all but the first selector circuit in the sequence to be non-responsive to signal(s) selected by previous selector circuits.

3 Claims, 2 Drawing Figures

SIGNAL DISCRIMINATING APPARATUS

This invention relates generally to signal discriminating apparatus for receiving a plurality of analogue electrical signals and for selecting, from those signals, one of which the value has some predetermined relationship to the values of the others.

For example, the apparatus may be operable for selecting the median of an odd number of signals, the median being the signal whose value exceeds the values of as many of the other signals as it is exceeded by.

According to the invention, there is provided signal discriminating apparatus comprising a plurality of extreme value selector circuits each of which is operable for considering a plurality of analogue input signals and for selecting, from amongst those signals, one of which the value represents a limit of a value range just containing the values of all the considered signals, the apparatus further including disabling means for controlling each of at least all but one of the said selector circuits so that it removes from those which it considers one or more of a plurality of signals which it actually receives, the circuits all being arranged to receive the same plurality of analogue input signals and said disabling means being operable, in effect, to order the circuits into a series sequence with said one circuit as the first in the sequence and each other circuit controlled to remove from consideration thereby any received signal which has been selected by a circuit preceding it in the sequence.

Each extreme value selector circuit may be operable to select the signal of which the value is the highest of those considered.

Advantageously, each selector circuit comprises a plurality of comparator amplifier circuit cells arranged to receive respective ones of said received plurality of signals, and a common amplifier feedback line connected to all of the cells such that the feedback signal on this line is derived from the cell receiving said signal of which the value represents the limit of the range of values of the considered signals.

Said disabling means may then comprise a plurality of switch elements for disabling the feedback loop in respective comparator amplifier circuit cells and respective interconnections for causing each switch element to be controlled in dependence upon a signal formed in an associated cell of the next preceding selector circuit in the sequence.

Figure 2:
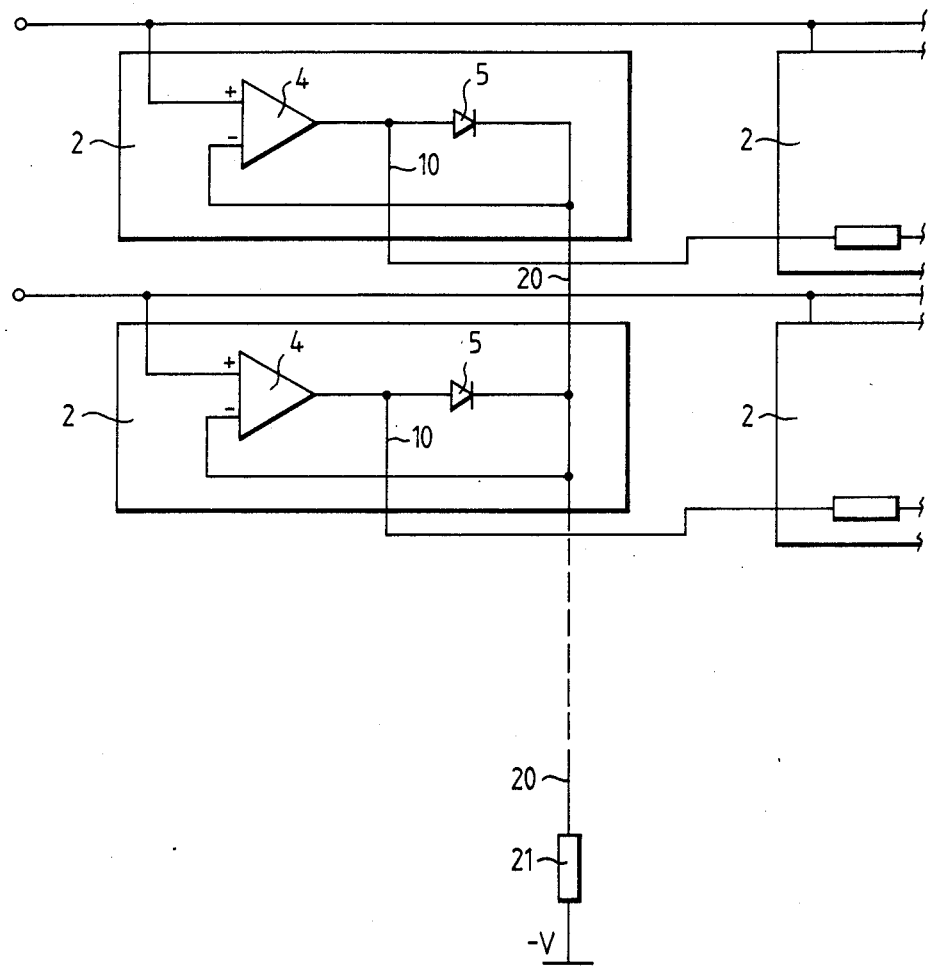

For a better understanding of the invention, reference will now be made by way of example, to the accompanying drawings, in which:

FIG. 1 is a partly simplified circuit diagram of an analogue median value finding apparatus, FIG. 2 is a circuit diagram of a modified comparator amplifier cell which may be used in the FIG. 1 apparatus.

The apparatus shown finds the value of the median of an odd number N of analogue input signals, the median being the signal which is greater than each of half the remaining signals and less than each of the other half, i.e. the $(N+1)/2$th highest signal. The apparatus comprises a row of $(N+1)/2$ maximum value selector circuits 1 each of which comprises N cells 2. The cells of each circuit are the same as each other and the same as the cells of each other circuit. Thus the cells form a matrix of rows and columns, each column forming one maximum value selector circuit and each row being operable to deal with a particular one of the N input signals. The N input signals are received at respective ones of N input terminals 3, each terminal 3 being connected to an input of each cell 2 in a respective row thereof. Within each cell, the appropriate input signal is received at the non-inverting input of a comparator amplifier 4 of which the output is connected to the anode of a diode 5. The cathode of diode 5 is connected to one side of a resistor 6 and to the cathode of a further diode 7. The anode of diode 7 is connected to a line 8 to which there is also connected the anodes of the corresponding diodes of all the other cells in the same column and the inverting inputs of the comparator amplifiers of all the cells in that column. Thus, there is a respective line 8 for each column of cells and each of these lines is supplied with a current signal from a respective constant-current source 9.

A connection 10 is made between the output of the amplifier 4 in each cell, apart from those in the last or $(N+1)/2$th column, to the other side of the resistor 6 of the cell in the same row but the next adjacent column. The other sides of the resistors 6 in the cells of the first column are not so connected because of course there is no preceding column. Instead, the resistors 6 in the first column are all connected to one side of a common resistor 11 of which the other side is connected to a source of negative potential $-V$.

Considering now the cells in the first column, i.e. the first maximum value finder circuit, each amplifier 4 thereof receives a respective one of the input signals at its non-inverting input while its inverting input receives a common feedback voltage from the associated line 8. Consideration of the arrangement will show that this feedback voltage is derived from which ever of the amplifiers is receiving the highest input signal voltage—this amplifier alone will be operating in a closed-loop manner while the output from each other amplifier will go negative. Thus, the connections 10 from the first column cells which were not receiving the highest value will each carry a "low" signal while the connection 10 from the first column cell which did receive the highest input signal will be "high". This "high" signal causes the diode 7 in the next cell of the same row to cut-off. This diode acts as a disabling switch element which when cut-off breaks the feedback loop around the associated amplifier and disables it. As a followon from this, all the other cells in that row will also be disabled.

The cells in the second column act in the same way as those of the first column except that since the highest input signal value cell has been disabled, the amplifier in the cell which is receiving the second highest input signal will be the only one operating in closed-loop manner and the feedback signal on the associated line 8 will be derived from the output of this amplifier. This amplifier thus also produces a high signal on the relevant connection 10 disabling the next cell and hence also each other cell in the same row.

The sequence continues as above with the cells in the third column sensing the third highest input signal value, the cells in the fourth column (if there is one) sensing the fourth highest value and so on. In the last column the $(N+1)/2$th highest signal is sensed, i.e. the desired median value. This value appears on the associated line 8 from which a connection is made to an output terminal 12.

In the first column of cells, all the resistors 6 are fed with a common enable signal via resistor 11 as mentioned earlier. Since none of these cells need to be disabled at any time, the construction of each could take the simplified form shown in FIG. 2. Here, the output of each amplifier 4 is again connected to the anode of a diode 5 and, via a connection 10, to the resistor 6 of the cell in the next column. However, no resistor 6 is provided in the first column cell and nor is there any diode 7. Instead, the cathode of diode 5 is connected, along with the cathodes of the diodes 5 of the other first column cells, to a common line 20. The inverting inputs of the amplifiers 4 of the first column cells are also connected to the line 20 and it is coupled via resistor 21 to the negative voltage source $-V$. The resistor 21 replaces the resistor 11 of FIG. 1 and in addition the FIG. 2 cell is not coupled to any current source 9.

I claim:

1. Median value signal selecting apparatus for receiving an odd number N of analog input signals and for selecting the median valued one of the input signals, the apparatus including $(N+1)/2$ extreme value selector circuits each of which comprises:

N comparator amplifiers each having a first and second input and an output and being operable to form at its output a signal having a magnitude and polarity dependent upon the relative values of signals applied to its first and second inputs, the first inputs of the comparator amplifiers of each selector circuit being connected for receiving respective ones of said analog input signals, a common signal line connected to the second input of each comparator amplifier, and N first diodes connected between the outputs of respective ones of the comparator amplifiers and said common signal line for passing thereto, and hence to the second input of each comparator amplifier, the output signal formed by that one of the comparator amplifiers which receives an extreme valued one of the analog input signals whereby each other comparator amplifier forms an output signal having a polarity opposite to that of the output signal formed by said one comparator amplifier;

at least each of all but a first one of said extreme value selector circuits further comprising N second diodes each connected in series opposition with a respective corresponding one of the first diodes between the output of the respective corresponding comparator amplifier and said common signal line, each second diode being coupled to the output of that one of the comparator amplifiers, in a respective one of the other selector circuits, which receives the same analog input signal as said respective corresponding comparator amplifier.

2. Apparatus according to claim 1, including constant current supply means connected to the common signal lines of at least all but said first of the extreme value selector circuits.

3. Apparatus according to claim 1, wherein said second diodes are coupled to the respective comparator amplifiers of said other selector circuit via resistor means.

* * * * *